Figure 1:
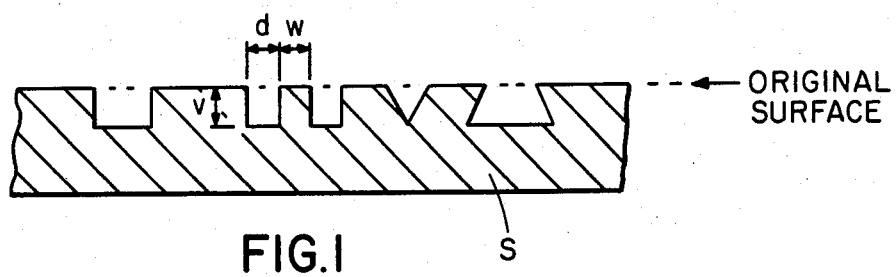

United States Patent [19]

Wiley et al.

[11] Patent Number: 4,630,094
[45] Date of Patent: Dec. 16, 1986

[54] USE OF METALLIC GLASSES FOR FABRICATION OF STRUCTURES WITH SUBMICRON DIMENSIONS

[75] Inventors: John D. Wiley; John H. Perepezko, both of Madison, Wis.

[73] Assignee: Wisconsin Alumni Research Foundation, Madison, Wis.

[21] Appl. No.: 709,836

[22] Filed: Mar. 8, 1985

Related U.S. Application Data

[63] Continuation of Ser. No. 181,988, Aug. 28, 1980, abandoned.

[51] Int. Cl.[4] .......................................... H01L 23/48
[52] U.S. Cl. ........................................ 357/67; 357/65; 357/68; 357/71; 428/923
[58] Field of Search ............... 428/573, 574, 575, 601, 428/606, 607, 901, 923, 620; 357/2, 71, 67, 68, 65; 365/34, 39, 163

[56] References Cited

U.S. PATENT DOCUMENTS

| | | | |
|---|---|---|---|
| 3,675,090 | 7/1972 | Neale | 357/2 |
| 3,699,543 | 10/1972 | Neale | 357/2 |
| 3,735,145 | 5/1973 | Heinz | 365/37 |
| 3,886,577 | 5/1975 | Buckley | 357/2 |
| 3,965,463 | 6/1976 | Chaudhari | 365/34 |
| 3,988,722 | 10/1976 | Keefe | 365/34 |
| 3,996,571 | 12/1976 | Chang | 365/34 |
| 4,006,276 | 2/1977 | George | 365/34 |
| 4,098,917 | 7/1978 | Bullock | 427/38 |
| 4,272,348 | 6/1981 | Cox et al. | 204/192 EC |
| 4,325,733 | 4/1982 | Aboaf et al. | 148/403 |
| 4,330,848 | 5/1982 | Gambino | 365/34 |

FOREIGN PATENT DOCUMENTS 2833891 2/1979 Fed. Rep. of Germany.

OTHER PUBLICATIONS

"Ion Etching for Pattern Delineation", Meliar-Smith, *J. Vac. Sci. Technol.*, vol. 13, No. 5, Sep./Oct. 1976, pp. 1008, 1020-1021.
"High Resolution Bubble Patterns Obtained by Electron Image Projection", Bril et al., *J. Vac. Sci. Technol.*, 16(6), Nov./Dec. 1979, pp. 1665-1667.
"Fabrication of Micro- and Submicron-Bubble Memory Devices . . . ", Furayama et al., *J. Vac. Sci. Technol.*, 15(3), May/Jun. 1978, pp. 998-1000.
"Electron-Beam Fabrication of High-Density Amorphous Bubble Film Devices", Ahn et al., (IEEE Transactions on Magnetics, vol. MAG-11, No. 5, Sep. 1975).
"Galvanomagnetic Effects in Amorphous Film Alloys", McGuire et al., (IEEE Transactions on Magnetics, vol. MAG-13, No. 5, Sep. 1977).

*Primary Examiner*—Melvyn J. Andrews
*Assistant Examiner*—John J. Zimmerman
*Attorney, Agent, or Firm*—Howard W. Bremer

[57] ABSTRACT

Patterned structures of submicron dimension formed of supported or unsupported amorphous metals having submicron feature sizes characterized by etching behavior sufficient to allow delineation of sharp edges and smooth flat flanks, resistance to time-dependent dimensional changes caused by creep, flow, in-diffusion of unwanted impurities, out-diffusion of constituent atoms, void formation, grain growth or phase separation and resistance to phase transformations or compound formation.

15 Claims, 4 Drawing Figures

USE OF METALLIC GLASSES FOR FABRICATION OF STRUCTURES WITH SUBMICRON DIMENSIONS

This application is a continuation of application Ser. No. 181,988, filed Aug. 28, 1980, now abandoned.

This invention relates to structures of submicron dimensions and to methods and materials used in the manufacture of same.

Methods and techniques have recently been made available to produce mechanical structures with lateral and/or vertical spatial dimensions of less than 1 $\mu$m ($\lesssim 1$ $\mu$m). Such techniques include electron beam and X-ray lithography.

Figure 2:
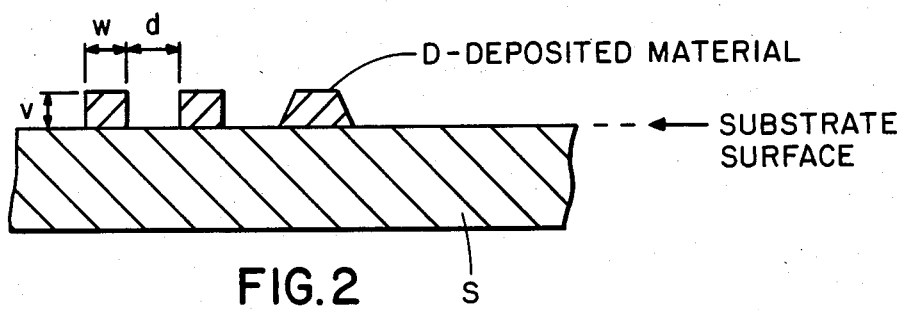
Figure 3:
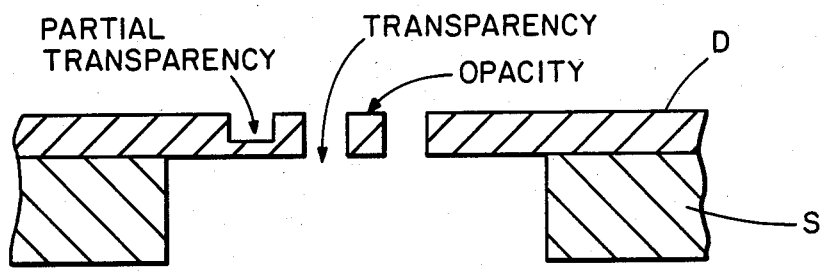
Figure 4:
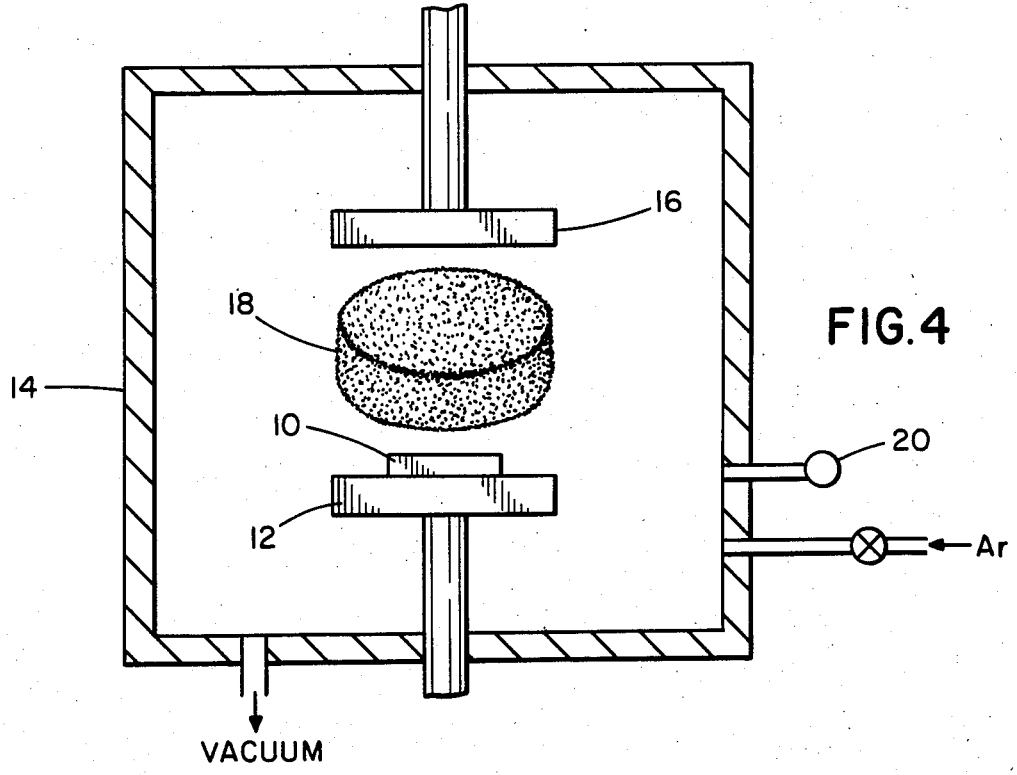

The invention will be illustrated with reference to the accompanying drawings in which:

FIGS. 1, 2 and 3 depict various procedures for producing structures embodying the features of this invention; and FIG. 4 is a diagrammatic view of an apparatus which can be used for deposition of an amorphous metal onto a substrate.

Structures that can be produced can be illustrated, but are not limited to the following:

(1) Holes, channels, grooves or other concave surface relief features formed in a planar surface of a solid specimen or substrate, as illustrated in FIG. 1 of the drawings, where the lower limits for v, d and w may be less than 1 $\mu$m ($\lesssim 1$ $\mu$m) and the substrate (S) may be any solid material susceptible to etching by chemical, electrochemical, plasma, ion beam or other controlled erosive technique.

(2) Mesas, stripes, islands or other convex surface relief structures consisting of a metal deposited on and adherent to a planar surface of a solid substrate specimen, as illustrated in FIG. 2, where the lower limits for v, d and w may be less than 1 $\mu$m ($\lesssim 1$ $\mu$m) and the deposited material D may be any solid material capable of being deposited on the substrate, as by evaporation, sputtering, chemical vapor deposition, rapid freezing electroplating, electroless plating, and other vapor or liquid deposition techniques in which D may be of the same or different chemical composition or microstructure as S.

(3) Combinations of 1 and 2 produced respectively in and on the same substrate to achieve a desired lateral structure.

(4) Combinations of 1 and 2 applied in sequence to achieve a desired vertical structure, including the possibility of including more than 1 layer of patterned material, as by the techniques of 1 and 2.

(5) Self supported or edge supported thin film structures containing features which are transparent, translucent or opaque to photons or particles of appropriate energies as illustrated in FIG. 3.

The patterned structures described have a number of important applications including, but not limited to:

(a) production of metallization patterns for transistors, integrated circuits, surface acoustic-wave devices, magnetic bubble devices, superconducting devices, semi-conductors, and other discrete or integrated arrays of electrical devices;

(b) production of patterned arrays of metal interconnects, semi-conductor devices, and semi-conducting or insulating optical waveguides in integrated optical systems;

(c) production of master masks and replica masks for lithographic applications;

(d) production of diffraction gratings;

(e) production of Fresnel zone plates;

(f) production of optical, chemical or biological filters as in films having a large number of small holes, such as formed on a supporting substrate of rock salt which is subsequently dissolved away;

(g) production of fine-scale surface structures for enhanced surface activity or catalytic behavior.

In accordance with the practice of this invention, materials S and/or D are metals for reasons of electrical conductivity, thermal conductivity, magnetic behavior, mechanical strength, bondability, opacity, reflectivity or combinations of such properties.

There are a number of factors that determine the minimum feature sizes achievable for v, d and w, as defined in FIGS. 1–3. These include wavelengths of radiation or the energy of particles used in the exposure; quality of the optics in the exposure system; exposure and development characteristics of the resist material, and the quality, feature sizes and transmission characteristics of the mask, when used.

This invention concerns itself with the patterned material S and D, the properties of which beneficially affect the quality, stability and ultimate spatial resolution of the final structure, including the etching behavior sufficient to allow the delineation of sharp edges, and smooth flat flanks in which the etch rate is controllable and spatially uniform over large distances in order to produce uniform cuts; resistance to time-dependent dimensional changes caused by creep, flow, in-diffusion of unwanted impurities, out-diffusion of constituent atoms, void formation, grain growth, phase separation, or other mechanisms controlled by diffusion transport; and resistance to phase transformations or compound formation.

Conventional metals perform adequately for S and D metals in applications in which the minimum feature sizes are greater than 1 $\mu$m ($\lesssim 1$ $\mu$m). Such conventional metals generally fall in many applications requiring features sizes of less than 1 $\mu$m ($\lesssim 1$ $\mu$m). Such failures stem primarily from the fact that conventional microscopic metal substrates and deposited films of such conventional metals have a polycrystalline microstructure. During etching (wet chemical or ion erosive) the grain boundaries between crystallites become etched at higher rates than the single crystal surfaces. It has been found, in some instances, that the etch rates vary from one crystallite to the next, depending somewhat on the crystallographic orientation of the exposed face. Under such circumstances, it has been found that good edge-definition requires fine-grained metals having a grain size smaller as compared to the desired feature size for v, d and w. The high concentration of grain boundaries in finely crystalline metals makes long term stability of the structure very unlikely for the following reasons:

(1) The high interfacial energy of grain boundaries makes the system unstable against grain growth with its attendant changes in microscopic geometry and dimensions.

(2) Grain boundaries and crystal dislocations provide paths of high diffusion rates for impurities and vacancies, often leading to the formation of voids, inclusions, hillocks and grooves. Impurities introduced via diffusion along grain boundaries or crystal dislocations can cause growth of intermetallic compounds.

Out-diffusion impurities can accumulate on the surfaces as new phases.

(3) The presence of grain boundaries or crystal dislocations in electrical current-carrying metals leads to enhanced electromigration and ultimately to catastroophic failure of the metal.

The problems described above become more severe as the dimensions of the microstructure are reduced.

These problems are overcome, in accordance with the practice of this invention, by the use of amorphous (glassy) phase metals in the fabrication of structures having submicron feature sizes. Such amorphous phase metals contain no grain boundaries or other microscopic inhomogeneities which could cause anisotropic or locally enhanced etching, and exhibit no crystalline order beyond a distance scale of 10–20 Å. The ultimate limit to edge definition achievable with such glassy phase metals is set by the size of the microscopic composition fluctuations which can be estimated to be on the order of 40 Å or less. The benefits will be retained to a large degree in materials consisting of a random distribution of crystalline separated from one another by the amorphous matrix as long as the volume fraction of crystallites is not more than 25% (preferably less than 10%), and the temperature is well below $T_g$.

Diffusion transport is exceptionally slow in glassy metals below the glass transition temperature $T_g$. As a result, the time-constant for creep, phase separation, or crystallization is effectively infinite on a laboratory time scale despite the fact that the glass phase is only kinetically metastable. Using shear viscosity $\eta$ as an example, at $T=T_g \eta \approx 10^{13}$ poise, and $\eta$ rises to much higher values below $T_g$ for typical glassy metals. These viscosities correspond to creep-relaxation times of $\approx 16$ minutes at $\eta = 10^{13}$p and hundreds of years at temperatures well below $T_g$. Glassy metals are mechanically, compositionally, and structurally stable at all practical temperatures to which they normally would be exposed in use. Impurity diffusion is considerably slower as compared to crystalline or polycrystalline metals since the diffusion in the latter is usually dominated by rapid diffusion along crystal dislocations or grain boundaries which are absent in glassy metals.

Amorphous metal systems that can be used in the practice of this invention are characterized by compositions having the general formula $T_x N_{1-x}$ in which $x \approx 0.8$, T is a transition metal and N is a polyvalent normal metal or metalloid as represented by $Pd_{0.8}Si_{0.2}$; $Au_{0.8}Ge_{0.2}$; $Co_{0.8}B_{0.2}$.

Use can also be made of pseudobinary compositions represented by the formula $(T_1)_n(T_2)_{0.8-n}N_{0.2}$, including even more complex substituted systems as well as systems containing only one or more transition metals as represented by Nb-Ni, which can be formed into sputtered glassy films. $Tg \approx 630°$ C., over the extraordinary composition range of $0.2 \approx \lesssim X \lesssim 0.8$.

Amorphous metals can be produced by rapid quench from the liquid or vapor phase. With metals having glass forming tendencies, sufficiently rapid vapor quench, amorphous metal films can be produced by conventional sputtering techniques.

Glassy or amorphous metals have room temperature electrical and thermal conductivities which are only slightly less than corresponding crystalline transition metals such that they behave electrically as normal metals. When these properties are coupled with the structural advantages, amorphous or glassy metals find advantageous use in a wide variety of mechanical and/or electrical devices calling for metallizations containing submicron features.

Having described the basic concepts of the invention, the following is given by way of illustration, but not by way of limitation.

Deposition of amorphous metal to provide the layer S in FIG. 1, the deposits D in FIG. 2, or the thin film in FIG. 3, can be effected in a number of ways, such as described in our copending application Ser. No. 81,859, filed Oct. 4, 1979, and entitled "Highly Reliable Metal Contacts for High Temperature Semi Conductor Application".

As illustrated in the drawing, a surface 10, on which the amorphous metal is to be deposited, is supported on an anode 12 housed within a sealed vacuum chamber 14 which is backfilled with inert gas, such as argon, to a pressure of from 1–50 Torr. A cathode 16 is mounted within the sealed chamber in spaced parallel relation to the anode.

The metal or alloy to be deposited in the amorphous state on the surface 10, such as $Pd_{0.8}Si_{0.2}$ or $Co_{0.8}B_{0.2}$, is arranged on the face of the cathode. At a power level of 1 KW, the argon is ionized, causing a glow discharge 18 between the cathode 16 and the anode 12. Such argon ions are attracted to the cathode where they are effective to knock loose atoms of the metal or alloy. The dislodged atoms travel to the anode where some of them strike and adhere to the surface 10.

In the event that the temperature conditions are such as ordinarily to raise the anode above desirable levels, a coolant such as water or glycol can be circulated through the anode and surface so that only amorphous metal will be deposited on the surface.

When it is desirable to restrict amorphous metal deposition to mesas, stripes, or other convex surface relief structures, as illustrated in FIG. 2, the surface is covered with a mask having the desired openings through which the displaced atoms can pass for deposition in the desired pattern onto the surface. Alternatively, standard photolithographic techniques can be used to pattern continuously deposited films (i.e. films which initially cover the entire underlying substrate in a continuous fashion).

In the event that a thin film of amorphous metal is desired to be deposited onto the surface, the entire surface is exposed for amorphous metal deposition for use in subsequent treatment, such as etching by chemical, electrochemical, plasma, ion beam or other known erosive techniques for metal removal to form holes, channels, grooves or other concave surface-relief feature as illustrated in FIG. 1, or the film can be removed as a self-supporting film of amorphous metal and process as described above to provide features which are transparent, translucent or opaque to photons or particles of appropriate energy, as illustrated in FIG. 3.

The deposition process described is generally referred to as a DC Getter sputtering system. Instead, use can be made of RF sputtering for amorphous metal deposition by sputtering from composite electrodes.

In the DC system, the cathode, anode and surface are enclosed in a sealed chamber. Depositions can be carried out at argon or other inert gas pressures in the range described and at a power level of less than 1 KW ($\lesssim 1$ KW). The RF system allows higher sputtering rates at relatively low inert gas pressures, such as less than 5 Torr ($\lesssim 5$ Torr). RF sputtering produces a more uniform film, espcially when use is made of a cathode of relatively large dimension.

Other methods for deposition of amorphous metals onto a screened surface for producing structures of the type illustrated in FIG. 2, or thin films for use in producing structures illustrated in FIGS. 1 and 3, include evaporation from composite sources.

We claim:

1. Patterned structures in contact with semiconductor regions having physical, geometric features of submicron dimension formed of amorphous metals having submicron feature sizes characterized by etching behavior sufficient to allow delineation of sharp edges and smooth flat flanks and without grain boundaries or other microscopic inhomogeneities which could cause anisotropic or locally enhanced etching.

2. Patterned structures of submicron dimension as claimed in claim 1 characterized by resistance to time-dependent dimensional changes caused by creep, flow, in-diffusion of unwanted impurities, out-diffusion of constituent atoms, void formation, grain growth or phase separation.

3. Patterned structures of submicron dimension as claimed in claim 1 characterized by resistance to phase transformations or compound formation.

4. Patterned structures of submicron dimension as claimed in claim 1 in which the amorphous metal is characterized by a lack of crystallinity on a distance scale of 10–20 angstroms.

5. Patterned structures of submicron dimension as claimed in claim 1 in which the amorphous metal has a binary composition having the formula $T_x N_{1-x}$ in which x is approximately 0.8, T is a transition metal and N is a normal metal or metalloid.

6. Patterned structures of submicron dimension as claimed in claim 5 in which T is selected from the group consisting of Pd, Au and Co.

7. Patterned structures of submicron dimension as claimed in claim 5 in which N is selected from the group consisting of Si, Ge and B.

8. Patterned structures of submicron dimension as claimed in claim 1 in which the amorphous metal has a pseudobinary composition having the formula $(T_1)_n(T_2)_{0.8-n}N_2$ in which $T_1$ and $T_2$ are transition metals, N is a normal metal or metalloid and $0.2 \leq n \geq 0.8$.

9. Patterned structures of submicron dimension as claimed in claim 8 in which $T_1$ and $T_2$ are selected from the group consisting of Pd, Au and Co.

10. Patterned structures of submicron dimension as claimed in claim 8 in which N is selected from the group consisting of Si, Ge and B.

11. Patterned structures of submicron dimension as claimed in claim 1 in which the patterned structure is in the form of holes, channels, grooves or other recessed surface features formed in a planar surface of an amorphous metal layer.

12. Patterned structures of submicron dimension as claimed in claim 1 in which the patterned structure is in the form of mesas, stripes, islands or other raised structures of amorphous metal bonded onto the surface of a substrate.

13. Patterned structures of submicron dimension as claimed in claim 1 in which the patterned structure is a combination of holes, channels, grooves or other recessed surface features and mesas, stripes, islands or other raised structures.

14. Patterned structures of submicron dimension as claimed in claim 1 in which the patterned structure is a combination of holes, channels, grooves or other recessed surface features in a first layer and mesas, stripes, islands or other raised structures in a second layer.

15. Patterned structures of submicron dimension as claimed in claim 1 in which the amorphous metal contains crystallites in a volume fraction not exceeding 25%.

* * * * *